(12) United States Patent
Hankins et al.

(10) Patent No.: US 7,045,170 B1
(45) Date of Patent: May 16, 2006

(54) ANTI-STICTION COATING FOR MICROELECTROMECHANICAL DEVICES

(75) Inventors: Matthew G. Hankins, Albuquerque, NM (US); Thomas M. Mayer, Albuquerque, NM (US); David R. Wheeler, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 264 days.

(21) Appl. No.: 10/115,411

(22) Filed: Apr. 3, 2002

(51) Int. Cl.
*C23C 16/24* (2006.01)
*C23C 16/00* (2006.01)

(52) U.S. Cl. .................. 427/255.18; 427/255.11; 427/255.14; 427/255.39

(58) Field of Classification Search ............ 427/248.1, 427/255.11, 255.14, 255.15, 255.18, 255.28, 427/255.17, 255.39, 255.393, 255.394
See application file for complete search history.

(56) References Cited

U.S. PATENT DOCUMENTS

| | | | | |
|---|---|---|---|---|
| 3,903,052 | A * | 9/1975 | Wagner et al. | 528/21 |
| 4,529,659 | A * | 7/1985 | Hoshino et al. | 428/422 |
| 4,671,933 | A * | 6/1987 | Lengnick et al. | 422/9 |
| 4,795,622 | A * | 1/1989 | Isoda et al. | 423/324 |
| 5,128,416 | A * | 7/1992 | Imai et al. | 525/254 |
| 5,542,295 | A | 8/1996 | Howe et al. | |
| 5,822,170 | A | 10/1998 | Cabuz et al. | |
| 6,114,044 | A | 9/2000 | Houston et al. | |
| 6,391,803 | B1 * | 5/2002 | Kim et al. | 438/787 |
| 6,576,489 | B1 * | 6/2003 | Leung et al. | 438/52 |
| 2003/0036085 | A1 * | 2/2003 | Salinaro et al. | 435/6 |

FOREIGN PATENT DOCUMENTS

JP  8325274  12/1996

OTHER PUBLICATIONS

Maboudin, Roya, "Surface processes in MEMS technology," *Surface Science Reports 30*, 207 (1998).
de Boer, et al., "Tribology of MEMS," *MRS Bulletin*, Apr. 2001, pp. 302-304.
Bunker, et al., "The Impact of Solution Agglomeration on the Deposition of Self-Assembled Monolayers," *Langmuir 20*, 7742 (2000).
Mayer, et al., "Chemical Vapor Deposition of Fluoroalkylsilane Monolayer Films for Adhesion Control in Microelectromechanical Systems," *J. Vac. Sci. Technol. B18*, 2433 (2000).

* cited by examiner

*Primary Examiner*—Timothy Meeks
*Assistant Examiner*—Eric B. Fuller
(74) *Attorney, Agent, or Firm*—Kevin W. Bieg

(57) ABSTRACT

A method for depositing an anti-stiction coating on a MEMS device comprises reacting the vapor of an amino-functionalized silane precursor with a silicon surface of the MEMS device in a vacuum chamber. The method can further comprise cleaning the silicon surface of the MEMS device to form a clean hydroxylated silicon surface prior to reacting the precursor vapor with the silicon surface. The amino-functionalized silane precursor comprises at least one silicon atom, at least one reactive amino (or imine) pendant, and at least one hydrophobic pendant. The amino-functionalized silane precursor is highly reactive with the silicon surface, thereby eliminating the need for a post-process anneal step and enabling the reaction to occur at low pressure. Such vapor-phase deposition of the amino-functionalized silane coating provides a uniform surface morphology and strong adhesion to the silicon surface.

21 Claims, 3 Drawing Sheets

ANTI-STICTION COATING FOR MICROELECTROMECHANICAL DEVICES

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention comprises a method for depositing a hydrophobic coating on a silicon surface and, more particularly, to a method for the chemical vapor deposition (CVD) of amino-functionalized silane precursors as anti-stiction coatings for microelectromechanical systems (MEMS) devices.

BACKGROUND OF THE INVENTION

Surface micromachining is the process used to fabricate many MEMS devices. With surface micromachining, the MEMS device structure can be built up on a silicon substrate using chemical vapor deposition to alternately deposit layers of structural polycrystalline silicon (polysilicon) and a sacrificial material (e.g., plasma-enhanced CVD silicon dioxide or a silicate glass). Each deposited layer of polysilicon or sacrificial material can be patterned using a photolithographically defined mask and etching. Such patterned multi-layer structures have lateral dimensions of 5–500 microns and layer thicknesses of less than a few microns. After the multi-layer structure is built up, the MEMS device can be released by selective wet etching of the sacrificial layers in aqueous hydrofluoric acid (HF). After etching, the released MEMS device structure can be rinsed in deionized water to remove the etchant and etch products.

Due to the large surface area-to-volume ratio of compliant structures, a MEMS device is susceptible to interlayer or layer-to-substrate adhesion during the release process (release adhesion) or subsequent device use (in-use adhesion). This adhesion phenomenon is more generally called stiction. Stiction is exacerbated by the ready formation of a 5–30 angstrom thick native oxide layer on the silicon surface, either during post-release processing of the MEMS device or during subsequent exposure to air during use. Silicon oxide is hydrophilic, encouraging the formation of water layers on the native oxide surfaces that can exhibit strong capillary forces when the small interlayer gaps are exposed to a high humidity environment. Furthermore, Van der Waals forces, due to the presence of certain organic residues; hydrogen bonding; and electrostatic forces also contribute to the interlayer attraction. These cohesive forces can be strong enough to pull the free-standing released layers into contact, causing irreversible latching and yielding the MEMS device inoperative.

Drying techniques, such as freeze-sublimation and supercritical carbon dioxide drying, have been shown to prevent liquid formation during the release process, thereby preventing capillary collapse and release adhesion. Furthermore, stiction can be reduced by minimizing contact surface areas, designing MEMS device structures that are stiff in the out-of-plane direction, and hermetic packaging. However, in-use adhesion remains a serious reliability problem with MEMS devices.

Surface modification is one means to produce low surface energy, hydrophobic surfaces, thereby inhibiting in-use adhesion in released MEMS devices. Any surface modification or coating process must be compatible with subsequent device fabrication processes, including the back-end processes of wafer dicing, die attachment, and hermetic encapsulation. These later packaging processes can require elevated temperatures of up to 500° C. and compatibility with inert gas or vacuum encapsulating environments. Furthermore, a coating should not introduce stress gradients and should coat surfaces that are inaccessible to conventional line-of-sight deposition processes. Roya Maboudian, "Surface processes in MEMS technology," *Surface Science Reports* 30, 207 (1998).

Most coating processes have the goal of producing a thin surface layer bound to the native silicon oxide that presents a hydrophobic surface to the environment. In particular, coating the MEMS device surface with self-assembled monolayers (SAMs) having a hydrophobic tail group has been shown to be effective in reducing in-use adhesion. SAMs have typically involved the deposition of organosilane coupling agents, such as octadecyltrichlorosilane and perfluorodecyltrichlorosilane, from nonaqueous solutions after the MEMS device is released.

FIG. 1 shows the formation of a typical chlorosilane-based SAM on a hydroxylated silicon surface. Currently used SAM precursors are deposited via a standard nucleophilic type II ($S_N2$) reaction. Surface self-assembly is thought to occur by a hydrolysis reaction of the chlorosilane coupling agent with water, releasing hydrogen chloride to form hydroxysilanes that hydrogen bond to each other and surface hydroxyl groups to form a dense monolayer on the silicon surface. Upon heating of the hydrogen-bonded monolayer, a condensation reaction is then thought to occur in which the hydroxyl groups react with each other to form siloxane cross-linkages to neighboring silanes within the monolayer and covalent bonds to the oxide surface. The hydrocarbon or fluorocarbon tail groups thereby provide an effective anti-stiction coating on the MEMS device surface.

However, the deposition of chlorosilane-based SAMs from liquid has been shown to be unreliable in practice, due to the need to control trace amounts of water in the nonaqueous deposition solvent, micelle formation in and instability of the precursor solutions, incomplete wetting of high aspect ratio MEMS device structures, disposal of the solvent waste, and degradation of the SAM coatings in high temperature and humid ambients. M. P. de Boer and T. M. Mayer, "Tribology of MEMS," *MRS Bulletin*, April 2001, pp. 302–304 and B. C. Bunker et al., *Langmuir* 16, 7742 (2000).

Vapor phase deposition of anti-stiction coatings has numerous advantages over solution-phase processes, including efficient transport into high-aspect-ratio MEMS device structures, conformal coverage, control of the deposition environment, and avoidance of waste solvents. For the vapor deposition of anti-stiction coatings on the surface of MEMS devices, precursors must be vaporized and then brought into contact with the surface on which the coating forms. However, for vapor-phase deposition of coating materials on MEMS devices, the type of leaving functionality is critical to the effectiveness of the coating process.

For example, vapor-deposited anti-stiction coatings have been synthesized from tridecafluoro-1,1,2,2-tetrahydrooctyltrichlorosilane (FOTS) and water vapor in a low pressure CVD process at room temperature. However, the use of a chloro-functionality has been found to result in incomplete adhesion of the chlorosilane precursor to the silicon dioxide surface. As with solution-phase SAM coatings, chloro-functionalized and hydroxy-functionalized precursors react slowly with the surface and require the addition of water vapor and an anneal step to enable the formation of bonds. Furthermore, the larger precursor molecules are preferred for SAM coatings, since hydrophobicity and thermal stability generally decrease with lower molecular weight. However, to achieve adequate coverage, the chlorosilane precursor should be applied at pressures above 0.1 Torr. This high-pressure requirement makes it impractical to use the same chlorosilane precursors that are presently being used with solution-phase chemical deposition of SAMs because their vapor pressure is too low for effective vapor phase depositions, due to their high molecular weight. T. M. Mayer et al., "Chemical Vapor Deposition of Fluoroalkylsilane Monolayer Films for Adhesion Control in Microelectromechanical Systems," J. Vac. Sci. Technol. B18, 2433 (2000).

Thus, there remains a need for a reliable anti-stiction coating for MEMS devices that is compatible with MEMS fabrication processes. The present invention provides a method for the CVD of amino-functionalized silane precursors that can be used as anti-stiction coatings on MEMS devices.

The use of the amino-functionality for the silane precursor mitigates many of the problems associated with chlorosilane coupling agents for SAM coatings. For example, aminosilane precursor molecules having an amino leaving-group react immediately with the silicon oxide surface and do not require the addition of water vapor to effectuate the reaction. The process produces direct covalent bonds between the surface and the precursor, and thus eliminates the need for a post-process anneal step. Multiple amino pendants can provide additional reactivity. For example, $Si(NMe_2)_4$ reacts with a surface hydroxyl group yielding a covalently bound species with a high density of additional dimethylamino reactive centers. Also, the reaction may be performed at very low pressure ($10^{-5}$ Torr) which is generally required when using precursors having a high molecular weight.

The vapor-phase deposited anti-stiction coatings of the present invention exhibit more uniform surface morphology and stronger adhesion to the surface than solution-phase SAMs. Vapor-deposited coatings exhibit better lubrication characteristics, adsorb less water, and have longer-term stability. Vapor-deposited coatings also have fabrication advantages as compared to solution-phase SAMs. The vapor deposition process is more easily scalable to full wafers and consumes less solvent and precursor. In addition, the vapor deposition process takes less time, can be more easily automated, and is more repeatable.

The vapor deposition process of the present invention further provides a means for conditioning the silicon surface (or priming the surface) so that a dense precursor coating can be deposited. When the primed surface is treated in an $O_2/H_2$ plasma, the resultant surface contains a greater number of hydroxyl groups than the untreated silicon surface. After conditioning, a hydrophobic anti-stiction coating can be deposited at a higher density than occurs with the untreated surface.

SUMMARY OF THE INVENTION

The present invention provides a method for depositing an anti-stiction coating on a silicon surface of a MEMS device, comprising reacting the vapor of an amino-functionalized silane precursor with the silicon surface of the MEMS device in a vacuum chamber. The method further comprises cleaning the silicon surface of the MEMS device prior to reacting the amino-functionalized silane precursor with the silicon surface. The amino-functionalized precursor comprises at least one silicon atom, at least one reactive amine (or imine) pendant attached to the at least one silicon atom, and at least one hydrophobic pendant attached to the at least one silicon atom.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

The present invention is directed to the chemical vapor deposition of self-assembled monolayers from amino-functionalized silane precursors for use as anti-stiction coatings for MEMS devices.

Figure 1:
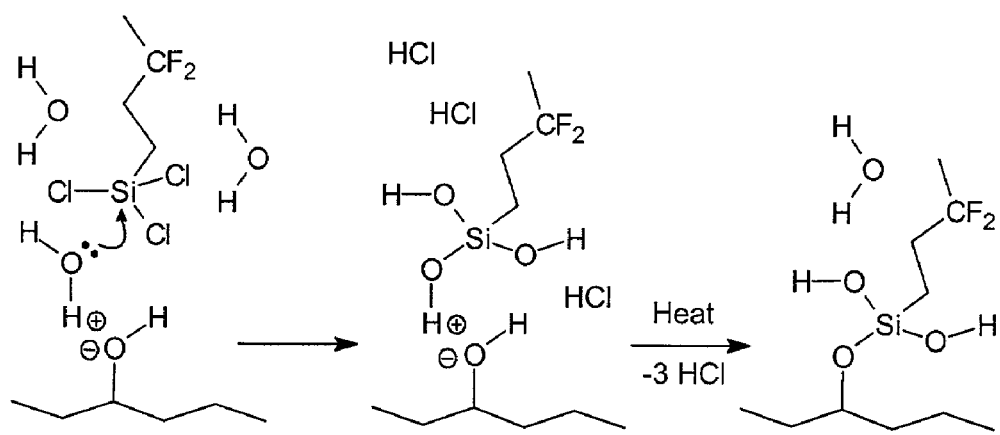
FIG. 1 shows a schematic illustration of the formation of a chlorosilane-based SAM on a hydroxylated silicon surface of a MEMS device.
Figure 2:
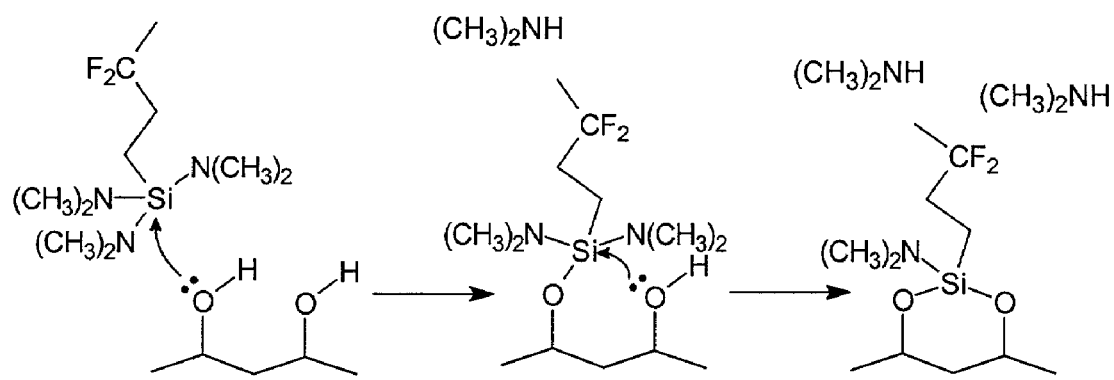
FIG. 2 shows a schematic illustration of the formation of an anti-stiction coating by CVD of an amino-silane precursor on a hydroxylated silicon surface of a MEMS device.

FIG. 2 shows an example of the formation of an aminosilane-based anti-stiction coating by CVD of an amino-functionalized silane precursor on a hydroxylated silicon surface. In the $S_N2$ reaction illustrated, a dimethylaminosilane precursor reacts with surface hydroxyl group to form a silane-to-surface siloxane bond and cleave a secondary amine leaving group. The hydrophobic tail group can be hydrogen, a hydrocarbon, or a fluorocarbon (as shown).

In general, the amino-functionalized silane precursor can be an aminosilane comprising at least one silicon atom having at least one reactive amine (or imine) pendant and at least one hydrophobic pendant attached to the silicon atom. A variety of amino-functionalized silane precursors are suitable for use with the present invention. These include precursors wherein the number and type of hydrocarbon pendants attached to the silicon atom is varied, the number and type of amine (or imine) pendants attached to the silicon atom is varied, the number and type of hydrofluorocarbon pendants attached the silicon atom is varied, the number of silicon atoms is varied, and cyclic aminosilanes comprising two of the reactive amine functions.

The number and type of hydrocarbon pendants attached to the silicon atom of the amino-functionalized silane precursor can be varied. Examples of aminosilane precursors with alternative hydrocarbon pendants are:

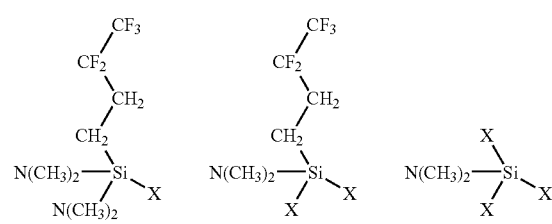

where X is a hydrocarbon pendant that can be straight or branched and can comprise alkyl or aryl groups. There can be up to 3 hydrocarbon pendants attached to the silicon atom. The non-hydrocarbon pendants can be hydrogens or hydrofluorocarbons and at least one reactive amine pendant. The following are some examples of hydrocarbon pendants, although other hydrocarbon pendants are also suitable for the present invention:

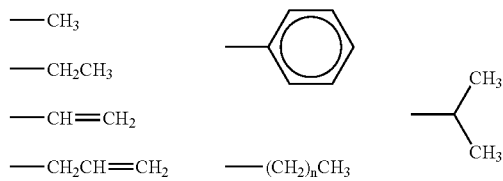

where n is an integer generally from 1 to 20.

The number and type of reactive amine pendants attached to the silicon atom can also be varied. Examples of aminosilane precursors with alternative amine pendants attached to the silicon atom are:

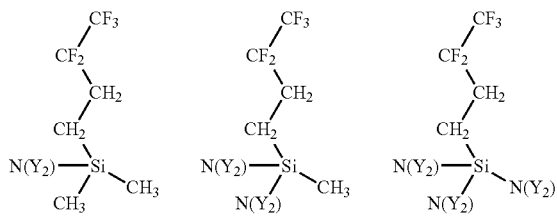

where Y is an amine hydrogen or alkyl- or aryl-hydrocarbon and wherein the Y groups can be different. There can be 1 to 3 amine pendants attached to the silicon atom. The other non-amine pendants attached to the silicon atom can be hydrogens, hydrocarbons, or hydrofluorocarbons. The following are examples of suitable Y groups attached to the amino nitrogen atom, although Y is not limited to these:

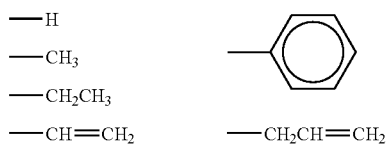

The amine pendant can also be a cyclic functionality wherein the ring is formed by joining together the ends of the two Y groups attached to the amine. Examples of cyclic amines are shown below, although the varieties of cyclic amines that can be used are not limited to these:

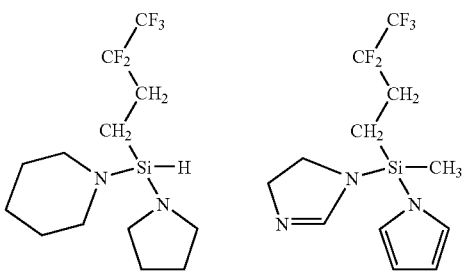

The reactive pendant can also be an imine wherein the two Y groups are combined into a single group that forms a double bond to the nitrogen atom. Examples of imine pendants are shown below, but these are not exclusive:

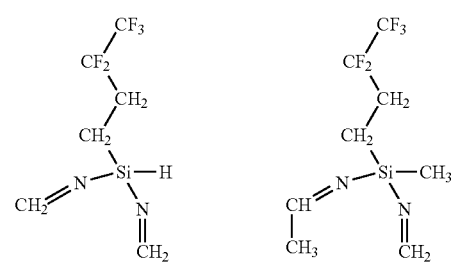

The number and type of hydrofluorocarbon pendants attached to the silicon atom can be varied. Examples of aminosilane precursors with alternative hydrofluorocarbon pendants are:

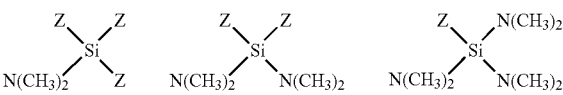

where Z is a hydrofluorocarbon pendant that can be straight or branched and wherein the Z pendants can be different. There can be up to 3 hydrofluorocarbon pendants. The other non-hydrofluorocarbon pendants attached to the silicon atom can be hydrogens or hydrocarbons with at least one reactive amine pendant.

Examples of alternative hydrofluorocarbon pendants are:

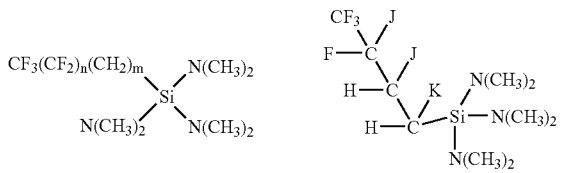

The hydrofluorocarbon pendant can be straight or branched as shown above. The integer n is typically from 0 to 16 and the integer m is typically from 2 to 19. The group J can be another hydrocarbon, fluorocarbon or hydrofluorocarbon and the J groups can be different. The group K can be another hydrocarbon or hydrofluorocarbon. Branching groups can be attached to one or more of the carbons on the hydrofluorocarbon pendants. Examples of J and K include the following groups, but are not limited to these:

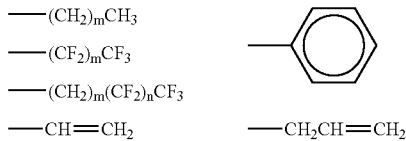

The fluorocarbon group shown above can be attached at site J. The integer m can be a number from 0 to 18 and n can be an integer from 0 to 18.

The number of silicon atoms can also be varied. Examples of amino-functionalized silane and siloxane precursors with alternative number of silicon atoms are:

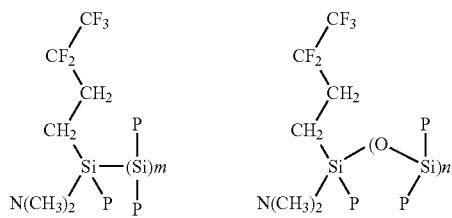

where P can be an amine, hydrogen, a hydrocarbon, or a hydrofluorocarbon pendant and wherein the pendants can be different. The integer m can be 1, 2, or 3 and the integer n can be 1 to 8. At least one reactive amine pendant can be attached to a silicon atom.

The amino-functionalized silane precursor can also be a cyclic aminosilane, and wherein two of the amine functions are incorporated into the ring. Examples of cyclic aminosilanes are:

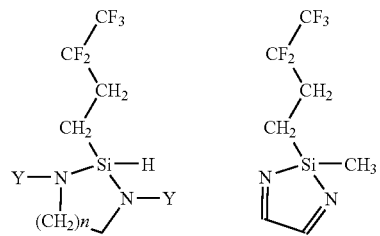

where Y is hydrogen or hydrocarbon. The number of carbons between nitrogen atoms is a minimum of two. The integer n is typically 1 to 4. The cyclic aminosilanes can also have a variable number and type of pendant attached to the silicon atom. The other pendants attached to the silicon aside from the cyclic group can be hydrogen, an amine, a hydrocarbon, or a hydrofluorocarbon.

Figure 3:
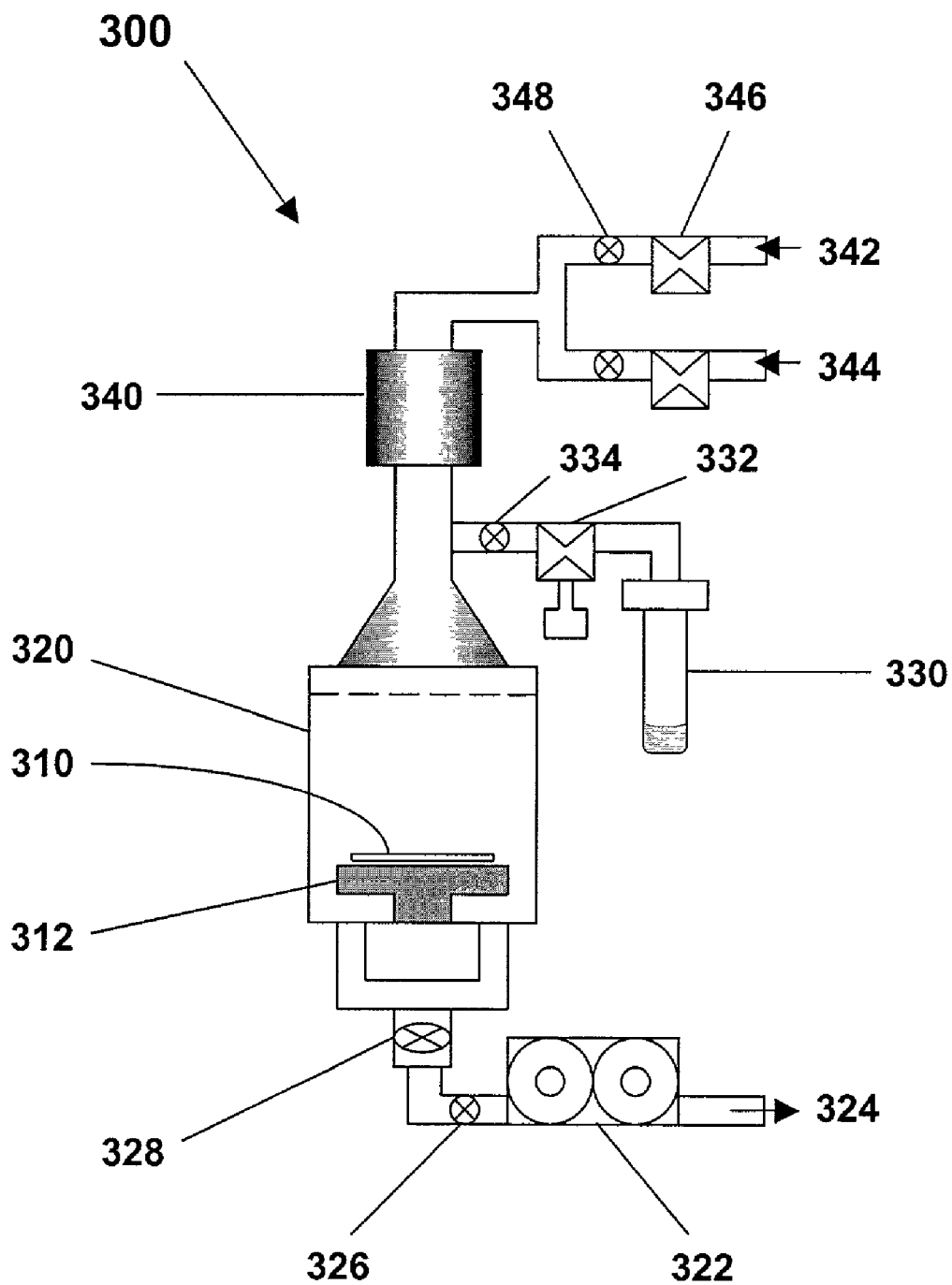
FIG. 3 shows a schematic illustration of a system for the chemical vapor deposition of an anti-stiction coating on a MEMS device.

FIG. 3 shows a single-chamber vacuum system 300 for the chemical vapor deposition of an anti-stiction coating on a MEMS device 310. The MEMS device 310 can comprise a full wafer, parts of a wafer, or an individual die. The CVD system 300 can comprise a vacuum chamber 320, a vacuum pump 322 to evacuate the chamber 320 through exhaust line 324, a chamber isolation valve 326 to seal the vacuum chamber during coating deposition in the static mode, and a throttle valve 328 to control the chamber pressure and precursor flow rate during coating deposition in the continuous flow mode. The MEMS device 310 can be mounted on a chuck 312. The CVD system 300 can further comprise a precursor reservoir 330 containing the amino-functionalized precursor liquid, a precursor variable leak valve 332 to introduce the precursor vapor into the vacuum chamber 320, and a precursor isolation valve 334. The CVD system 300 can further comprise a means to clean the MEMS device surface. For downstream cleaning of the MEMS device 310, the CVD system 300 can include a microwave source 340 for generation of a cleaning plasma, an inlet for oxygen gas 342, and an inlet for other cleaning gases 344. The flow rate of the oxygen and cleaning gases can be controlled by cleaning gas mass flow controllers 346 and cleaning gas isolation valves 348. The CVD system 300 can also include means (not shown) to control the temperature of the chamber and precursor feed lines to inhibit condensation of precursor.

Alternatively, the CVD system can be a dual-chamber vacuum system (not shown), comprising a cleaning chamber to pre-clean the surface of the MEMS device 310 and a separate deposition chamber for chemical vapor deposition of the anti-stiction coating. The dual chambers can have an intermediate transfer chamber for the transfer of the MEMS device 310 between the cleaning and deposition chambers. The dual chamber system can also have a cassette chamber for loading the MEMS device 310 into the transfer chamber.

It is preferable that the MEMS device 310 have a clean, hydroxylated silicon surface for reaction with the amino-functionalized silane precursor. In particular, it is preferable to remove residual contaminants, such as water, methanol and organic compounds, from narrow channels of the MEMS device 310. These residues can prevent adhesion of the coating to the surface of the MEMS device 310 or combine with the precursor material to form reaction products that cause additional stiction. For example, liquids can be vacuumed out of the narrow channels at low pressure and cause MEMS components to adhere together. While supercritical drying processes can effectively eliminate solvents, these drying processes may leave the MEMS device surface terminated with methanol or other organic compounds unsuitable for reaction with the aminosilane precursor. Additionally, small amounts of residual organic compounds or surface terminations can react with the coating precursor and cause adhesion of parts.

Accordingly, the silicon surface of the MEMS device 310 can be cleaned prior to deposition of the anti-stiction coating. A variety of methods can be used to clean the surface, depending on the residual or surface termination left by the fabrication of the MEMS device 310. These cleaning methods include heating the MEMS device 310 at ambient pressure to a temperature greater than 100° C. in an inert environment, heating the MEMS device 310 at sub-ambient pressure and less than 100° C. in an inert environment, placing the MEMS device 310 in a dry environment for a period of time, cleaning surface residuals with a vapor-phase ozone system, and cleaning the surface with an oxidizing plasma.

Downstream plasma cleaning with an oxidizing plasma is an effective method to remove organic residues left on the surface of MEMS device 310 after supercritical drying. In particular, the organic residues can be removed from the surface by downstream plasma cleaning without affecting the mechanical functioning of the MEMS device 310. By optimizing plasma conditions, the surface can be thoroughly cleaned while leaving it terminated with silanol groups that are preferred for good adhesion of the anti-stiction coating. A mixture of oxygen and hydrogen with some percentage of an inert gas (i.e., argon, nitrogen, or helium) can be effective for plasma cleaning. Also, the mass flow of the cleaning gases, vacuum chamber pressure, and plasma power can be controlled to create the proper surface condition for obtaining well controlled, hydrophobic coatings.

It is preferred to use a plasma that will not create excessive oxide growth that may close interlayer gaps and cause parts of the MEMS device 310 to be welded together. Oxide growth can be controlled by including a small amount of reducing gas, such as hydrogen, in the cleaning gas mixture. A ratio of between one and twenty percent of hydrogen to oxygen adds enough of a reducing gas to the mixture to control oxide growth and properly condition the silicon surface for coating deposition. The cleaning gas mixture can be diluted with up to about 80% of an inert gas for safety reasons, to control oxide formation, and aid in surface preparation. With this cleaning gas mixture, amino-functionalized silane precursors can deposit at higher surface densities than with other plasma cleaning gases that contain only nitrogen, oxygen and/or an inert gas.

After the surface of the MEMS device 310 is cleaned, the amino-functionalized silane precursor can be reacted with the surface silanol groups to form the anti-stiction coating. Amino-functionalized silane precursors react directly with surface groups allowing bond formation without the addition of water or subsequent heating. The rate of a $S_N2$ reaction that occurs at the silicon surface between precursor and surface terminal groups is primarily a function of leaving group type. Film deposition is possible in either of two modes: static or continuous flow of precursor into the chamber. This fast reaction of aminosilanes with the silicon surface enables the use of either mode of processing.

In the static mode, the deposition chamber 320 can be evacuated with vacuum pump 322 and then gated off with chamber isolation valve 326 while the precursor isolation valve 334 to the precursor reservoir 330 containing the precursor liquid is left open. The precursor leak valve 332 can be adjusted manually to optimize for precursor volatility. The precursor vapor is thereby permitted to leak into the gated-off vacuum chamber 310 and the chamber pressure eventually rises to the vapor pressure of the precursor liquid when the surface coverage is complete.

In the continuous flow mode, the precursor vapor is continuously pumped through the chamber 320 at a low pressure that is controlled by the throttle valve 328. Previous, slower reacting, chlorosilanes and hydroxysilanes deposit very poorly when using the continuous flow mode. The amino-functionalized silane precursors provide equivalent or superior films in the continuous flow mode due to their higher reactivity and improved coverage.

The amount of ambient leakage into the deposition chamber 320 and the amount of material sorption on or in the chamber walls can be important in the CVD process. Stray vaporous species will dilute the concentration of the precursor and reduce reaction rates and film density. A well-sealed chamber 320 and heating of the chamber and feed line surfaces that come into contact with the precursor can help to prevent this contamination problem.

Close control of the system temperature is preferable to maintain high MEMS device yields. The temperature of the MEMS device 310 during deposition can be maintained at a temperature below that of the surrounding chamber surfaces and near or just slightly above the temperature of the precursor reservoir 330. Heating feed lines and chamber walls also helps to minimize unwanted condensation of precursor. The temperature of these surfaces can be maintained well above the temperature of the precursor reservoir 330 (e.g., a differential temperature of about 30–50° C.).

The rate of film growth on the surface of the MEMS device 310 is a function of precursor reactivity and the partial pressure of the precursor in the deposition chamber 320. Precursors that have a low ambient vapor pressure must be heated to elevated temperature to provide dense monolayer films in a reasonable time. If the molecule boils at a very high temperature (e.g., above 220° C. at 1 atm.), condensation of the precursor on cold spots in the vacuum chamber 320 may be observed even if surfaces are heated. For unbranched fluorocarbon precursors it may be difficult to deposit dense films if the material has a molecular weight greater than 600 g/mol.

Amino-functionalized silane precursors can react quickly with a variety of surfaces and organic molecules. If the precursor is permitted to react with the surface of the MEMS device 310 before it is thoroughly cleaned, the resulting reaction product can cause additional stiction and decrease device yield. To prevent this from happening, the cleaning and precursor reaction steps can be performed in separate chambers in a dual chamber vacuum system. Although not essential, separation of the cleaning and the reaction steps generally increases the device yield by reducing contaminant reaction with the precursor before the cleaning step is performed. Also, to prevent contamination of a common transfer chamber, the deposition chamber can be purged with an inert gas while the MEMS device 310 is still in the deposition chamber. The MEMS device 310 can then be removed from the deposition chamber and the chamber cleaned with a plasma to destroy any residual precursor. This method is usually effective for minimizing build-up of the precursor in areas that can foul the MEMS device 310 and reduce product yield.

EXAMPLE

As an example of the method of the present invention, a (tridecafluor-1,1,2,2-tetrahydrooctyl)-tris(dimethylamino) silane precursor was used to vapor deposit an anti-stiction coating on a silicon-based MEMS device 310 in a dual-chamber vacuum system. The dual-chamber vacuum system comprised a cleaning chamber to pre-clean the surface of the MEMS device 310 and a separate deposition chamber to deposit the anti-stiction coating.

The MEMS device 310 was placed into the vacuum system in a cassette. The vacuum system was pumped down slowly to about 500 millitorr. The MEMS device 310 was transferred into the cleaning chamber 320 and placed on a chuck 312 that was heated to 55° C. Downstream plasma cleaning was performed with a oxidizing plasma generated by a microwave source 340 that was adjusted to maximize the number of silanol surface species, while still providing adequate removal of organic contaminants. The cleaning gas isolation valves 348 were opened and oxygen gas was introduced through inlet 342 and nitrogen/hydrogen forming gas was introduced through inlet 344. Flow rate of the oxygen and forming gases were controlled by cleaning gas mass flow controllers 346. Chamber pressure was controlled by throttle valve 328. Optimized plasma conditions were obtained at a microwave power of 1000 watts, a flow rate of 980 sccm of nitrogen/5.5% hydrogen forming gas, and 600 sccm of oxygen at a chamber pressure of 2800 millitorr. This formulation produced a hydrogen/oxygen ratio of about 8.25%. The MEMS device 310 was cleaned in the microwave plasma for one minute in the cleaning chamber and then transferred to the deposition chamber through a common transfer chamber.

The (tridecafluor-1,1,2,2-tetrahydrooctyl)-tris(dimethylamino) silane precursor was deposited on the cleaned silicon surface of the MEMS device 310 in the continuous flow mode. The MEMS device 310 was placed on a chuck 312 that was heated to 35° C. in the deposition chamber 320. The precursor reservoir 330 containing the precursor liquid was also heated to a temperature of 35° C. The feed lines connecting the precursor reservoir 330 to the deposition chamber 320 were heated to 85° C. The walls and other parts of the deposition chamber 320 were heated to about 60 to 70° C. After evacuation of the deposition chamber 320 by vacuum pump 322, precursor vapor was introduced into the chamber 320 by opening precursor isolation valve 334. Precursor pressure was controlled by means of precursor variable leak valve 332 and throttle valve 328. The MEMS device 310 was exposed to the precursor vapor for 12.5 minutes while maintaining a precursor pressure of 2 to 10 millitorr in the deposition chamber 320. After complete reaction of the precursor with the surface to form the anti-stiction coating, the precursor isolation valve 334 was closed and the deposition chamber 320 was purged with 200 sccm nitrogen at 500 millitorr for two minutes. The coated MEMS device 310 was then returned to the common transfer chamber and the deposition chamber was then cleaned with a nitrogen plasma to prevent fouling of the vacuum system with any stray precursor. The coated MEMS device 310 was then returned to the cassette chamber and cassette chamber was vented slowly to atmosphere for removal of the coated MEMS device 310.

A plurality of polysilicon microengines where manufactured to compare the yield of functioning parts coated with a vapor-deposited amino-functionalized precursor with a chlorosilane-based SAM deposited from nonaqueous solution. Both the amino-functionalized precursor and the chlorosilane precursor had the same (hexadecafluoro-1,1,2,2-tetrahydodecyl) hydrophobic tail group. The polysilicon microengines were released by an HF etch and dried with supercritical carbon dioxide. The released and dried microengines were then coated with the amino-functionalized precursor according to the above-described CVD method or coated with the liquid-phase SAM. The yield of functioning microengines with vapor-deposited coatings was 25% higher than for those coated with liquid-phase SAMs. The contact angle of silicon substrates coated with the amino-functionalized precursors was between 103 and 106 degrees, suggesting that a dense monolayer coating was formed by the CVD method. Furthermore, atomic force micrographs (AFM) of the vapor-deposited coatings indicated a smooth surface, with no apparent change in roughness from a bare silicon surface. Conversely, surfaces coated with the liquid-phase SAM showed the presence of aggregated coating material and additional aggregate formation upon exposure to humidity. This aggregate formation is thought to be due to the sensitivity of the chlorosilane precursors to moisture and apparently accounts for the lower yield of functioning microengines coated with liquid-phase SAMs.

The embodiments of the present invention have been described as a method to vapor deposit amino-functionalized silane precursors on silicon surfaces for use as anti-stiction coatings for MEMS devices. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method for depositing an anti-stiction coating on a silicon surface of a MEMS device, comprising reacting the vapor of an amino-functionalized silane precursor, comprising at least one silicon atom, at least one reactive amino pendant having a nitrogen atom attached to the at least one silicon atom, and at least one hydrocarbon, fluorocarbon, or hydrofluorocarbon pendant attached to the at least one silicon atom, with the silicon surface of the MEMS device in a vacuum chamber to provide a hydrophobic surface.

2. The method of claim 1, further comprising continuously flowing the precursor vapor over the silicon surface of the MEMS device.

3. The method of claim 1, wherein the amino-functionalized silane precursor comprises an aminosilane having the general formula $Si(NY_2)_m X_{(m-n-1)} Z_n$, wherein $NY_2$ is amino; X is hydrocarbon; Z is hydrofluorocarbon; m is 1 to 3; and n is 0 to 3.

4. The method of claim 1, wherein the at least one reactive amino pendant comprises a dimethylamino group.

5. The method of claim 1, wherein the at least one reactive amino pendant has the general formula NYY' and Y and Y' are selected from the group consisting of hydrogen, alkyl hydrocarbon, and aryl hydrocarbon.

6. The method of claim 1, wherein the at least one reactive amino pendant comprises at least one cyclic amine.

7. The method of claim 1, wherein the at least one hydrocarbon pendant comprises alkyl hydrocarbon or aryl hydrocarbon.

8. The method of claim 1, wherein the amino-functionalized silane precursor further comprises at least one siloxane linkage.

9. The method of claim 1, wherein the amino-functionalized silane precursor comprises a cyclic aminosilane.

10. The method of claim 1, wherein the precursor vapor is drawn from a precursor reservoir containing the precursor liquid.

11. The method of claim 10, further comprising heating the vacuum chamber walls and feed lines to a temperature in excess of the temperature of the precursor liquid.

12. The method of claim 11, wherein the vacuum chamber walls and feed lines are heated to more than 30° C. above the temperature of the precursor liquid.

13. The method of claim 1, further comprising cleaning the silicon surface of the MEMS device prior to the step of reacting the vapor of the amino-functionalized silane precursor with the silicon surface.

14. The method of claim 13, wherein the step of cleaning is performed in a separate cleaning chamber and the method further comprises transferring the MEMS device from the cleaning chamber after the cleaning step to the vacuum chamber prior to the reacting step.

15. The method of claim 13, wherein the step of cleaning comprises heating the silicon surface to an elevated temperature in an inert environment, exposing the silicon surface to a vacuum environment, exposing the silicon surface to a dry environment, exposing the silicon surface to a vapor ozone environment, or exposing the silicon surface to an oxidizing plasma.

16. The method of claim 15, wherein the oxidizing plasma comprises oxygen.

17. The method of claim 16, wherein the oxidizing plasma further comprises an inert gas.

18. The method of claim 16, wherein the oxidizing plasma further comprises a reducing gas.

19. The method of claim 18, wherein the reducing gas comprises hydrogen.

20. The method of claim 19, wherein the oxidizing plasma comprises less than a 1:5 ratio of hydrogen to oxygen.

21. A method for depositing an anti-stiction coating on a silicon surface of a MEMS device, comprising reacting the vapor of an imino-functionalized silane precursor, comprising at least one silicon atom, at least one reactive imino pendant having a nitrogen atom attached to the at least one silicon atom, and at least one hydrocarbon, fluorocarbon, or hydrofluorocarbon pendant attached to the at least one silicon atom, with the silicon surface of the MEMS device in a vacuum chamber to provide a hydrophobic surface.

* * * * *